United States Patent
Hofmann et al.

(10) Patent No.: US 7,214,582 B2
(45) Date of Patent: May 8, 2007

(54) SEMICONDUCTOR SUBSTRATE AND SEMICONDUCTOR CIRCUIT FORMED THEREIN AND FABRICATION METHODS

(75) Inventors: Franz Hofmann, München (DE);
Volker Lehmann, München (DE);
Lothar Risoh, Neubiberg (DE);
Wolfgang Rösner, Ottobrunn (DE);
Michael Specht, München (DE)

(73) Assignee: Infineon Technologies AG, Munich (DE)

( * ) Notice: Subject to any disclaimer, the term of this patent is extended or adjusted under 35 U.S.C. 154(b) by 136 days.

(21) Appl. No.: 10/523,944

(22) PCT Filed: Sep. 13, 2003

(86) PCT No.: PCT/DE03/03044

§ 371 (c)(1),
(2), (4) Date: Feb. 8, 2005

(87) PCT Pub. No.: WO2004/027861

PCT Pub. Date: Apr. 1, 2004

(65) Prior Publication Data

US 2005/0269617 A1 Dec. 8, 2005

(30) Foreign Application Priority Data

Sep. 16, 2002 (DE) ................ 102 42 877

(51) Int. Cl.
*H01L 21/8242* (2006.01)

(52) U.S. Cl. ............ 438/239; 438/118; 438/240; 438/243; 438/386; 438/387; 438/406; 438/455; 257/E27.137; 257/E23.02; 257/E23.04; 257/E21.567

(58) Field of Classification Search ............ 438/239, 438/240, 243, 244, 386, 387, FOR. 220, 438/FOR. 430, 118, 406, 455, 466; 257/E21.137, 257/E27.161, E23.02, E23.023, E23.04, E21.088, 257/E21.567

See application file for complete search history.

(56) References Cited

U.S. PATENT DOCUMENTS 5,055,898 A * 10/1991 Beilstein et al. ............ 257/301
5,739,565 A * 4/1998 Nakamura et al. .......... 257/301
6,306,719 B1 10/2001 Lee
6,441,424 B1 * 8/2002 Klose et al. ................ 257/308

FOREIGN PATENT DOCUMENTS

DE 100 55 711 A1 5/2002

(Continued)

OTHER PUBLICATIONS

International Search Report from corresponding International application No. PCT/DE03/03044.

(Continued)

*Primary Examiner*—George Fourson
*Assistant Examiner*—Joannie Adelle Garcia
(74) *Attorney, Agent, or Firm*—Brinks Hofer Gilson & Lione

(57) ABSTRACT

A semiconductor substrate and a semiconductor circuit formed therein and associated fabrication methods are provided. A multiplicity of depressions with a respective dielectric layer and a capacitor electrode are formed for realizing buried capacitors in a carrier substrate and an actual semiconductor component layer being insulated from the carrier substrate by an insulation layer.

14 Claims, 3 Drawing Sheets

FOREIGN PATENT DOCUMENTS

| | | |
|---|---|---|
| DE | 101 33 688 A1 | 9/2002 |
| EP | 0 553 791 A1 | 8/1993 |
| EP | 0 921 572 A1 | 8/1998 |
| JP | 63151071 | 6/1988 |
| JP | 02035770 | 2/1990 |
| WO | WO 99/25026 | 5/1999 |

OTHER PUBLICATIONS

Examination Report from corresponding International application No. PCT/DE03/03044.

* cited by examiner

SEMICONDUCTOR SUBSTRATE AND SEMICONDUCTOR CIRCUIT FORMED THEREIN AND FABRICATION METHODS

This application is the national stage application of international application number PCT/DE2003/003044, filed on Sep. 13, 2003, which claims the benefit of priority to German Patent Application DE 102 42 877.8, filed on Sep. 16, 2002, incorporated herein by reference.

The present invention relates to a semiconductor substrate and semiconductor circuit formed therein and associated fabrication methods and, in particular, to an SOI substrate in which a multiplicity of buried capacitors are formed.

As the integration density of semiconductor circuits and in particular a storage density of DRAMs (Dynamic Random Access Memories) continue to increase undiminished, problems of accommodating the required storage capacitance on the decreasing cell area are encountered more and more. Although the technical refinement of so-called trench capacitors and of stacked capacitors is already far advanced, these processes will come up against their limits in the next few generations.

Furthermore, integrated capacitors in logic and analog semiconductor circuits represent a considerable additional outlay. This applies in particular to high-density so-called "embedded DRAMs" since the highly optimized and highly space-saving cell design of modern DRAMs requires a fabrication process which can no longer easily be combined with a logic process.

The storage capacitors in DRAMs, in particular, have many years of evolution behind them with the aim of keeping the capacitance virtually constant at approximately 30 fF, despite the ever-decreasing cell area. In order to realize capacitors of this type, two different embodiments are differentiated in this case. Firstly the "stacked capacitor" which is fabricated after the completion of a selection transistor and is connected to the transistor via a dedicated contact hole, the surface area of the storage electrode being enlarged for example by virtue of a cylindrical configuration. The second embodiment that is known is the trench capacitor, in which case, before the selection transistor is formed, a hole with a very high aspect ratio (depth:diameter) is etched into a semiconductor substrate and the capacitor is fabricated therein. In both variants the surface of the electrode can be roughened by means of hemispherical semiconductor grains (hemispherical grains, HFG) in order to further increase the capacitance. Despite these technological endeavors, in the foreseeable future the required capacitance will no longer be able to be achieved using the further-developed conventional capacitors.

Furthermore, the document EP 0 921 572 A1 discloses a method for fabricating capacitors for a DRAM cell, a semiconductor circuit being formed in a first semiconductor substrate and a multiplicity of capacitors being formed in a second Si substrate by means of electrochemical pore etching. The two substrates prepared in this way are subsequently brought into contact with one another in such a way that the contact areas of the semiconductor circuit touch a predetermined number of capacitors, thus resulting in predetermined overall capacitors for the circuit. However, increased difficulties in making contact with the finished semiconductor circuit and also contact-area-dependent capacitances are disadvantageous in this case.

Therefore, the invention is based on the object of providing a semiconductor substrate and also a semiconductor circuit formed therein and associated fabrication methods, it being possible to realize large capacitances in a particularly simple and cost-effective manner.

With regard to the semiconductor substrate, this object is achieved, in particular, by means of a carrier substrate and a semiconductor component layer with an insulation layer situated in-between, a multiplicity of depressions with a dielectric layer and an electrically conductive layer for realizing a multiplicity of capacitances being formed in the carrier substrate. When using a semiconductor substrate of this type, it is possible, moreover, for a semiconductor circuit formed therein to be contact-connected in a simple manner, capacitors having an increased capacitance furthermore being available.

The electrically conductive layer used for forming the multiplicity of capacitor electrodes is preferably also formed at the surface of the carrier substrate, as a result of which a multiplicity of individual capacitors can be combined in groups and fixedly prescribed capacitances can be realized. In the case of corresponding patterning of this electrically conductive layer for realizing a group capacitor having a capacitance of approximately 30 fF, the storage capacitors required in the DRAM, in particular, may already be present prefabricated in the semiconductor substrate.

The depressions for the capacitors are preferably formed by electrochemical pore etching, as a result of which a finely ramified pore system with an extraordinarily large surface area is obtained and, furthermore, short circuits or cross connections within the pores are automatically prevented.

A high-temperature-resistant capacitor dielectric with a high dielectric constant is preferably used for the dielectric layer formed in the pores, thus resulting on the one hand in increased capacitances and on the other hand in an improved insensitivity for the subsequent process steps during the realization of a semiconductor circuit in the semiconductor component layer.

The semiconductor substrate is preferably based on an SOI substrate having a monocrystalline Si layer as component layer, an $SiO_2$ layer as insulation layer and an Si substrate as carrier substrate, for which reason already known fabrication methods can be modified in a cost-effective manner and standard processes and fabrication apparatuses that are in use can continue to be used.

With regard to the method for fabricating a semiconductor substrate, firstly, a multiplicity of depressions and also a capacitor counterelectrode are formed in a carrier substrate and then a dielectric layer is fabricated at the surface of the depressions and of the carrier substrate. Afterward, an electrically conductive layer is formed for realizing a multiplicity of capacitor electrodes at least in the multiplicity of depressions and a first insulation partial layer is produced over the whole area. Furthermore, a semiconductor component substrate with a splitting-off boundary layer formed therein and a second insulation partial layer is provided and connected together with the carrier substrate by means of the respective insulation partial layers. Finally, part of the semiconductor component substrate is split off at the splitting-off boundary layer, as a result of which the final semiconductor substrate with the multiplicity of capacitors formed in the carrier substrate is obtained in a particularly simple and cost-effective manner.

Preferably, the depressions are formed by means of electrochemical pore etching for forming pores in a carrier substrate composed of semiconductor material and the capacitor counterelectrode is formed by doping the carrier substrate in the vicinity of the pores.

The capacitor dielectric used is preferably nitrided oxide, $Al_2O_3$ and/or $TiO_2$, as a result of which both a high temperature resistance and a high dielectric constant are obtained.

As electrically conductive layer for realizing the capacitor electrodes, preferably an in-situ-doped semiconductor material is deposited and patterned in such a way that a multiplicity of individual capacitors can be combined to form a group capacitor.

With regard to the semiconductor circuit, a DRAM memory cell is preferably formed as semiconductor component in the semiconductor substrate according to the invention, the capacitors situated in the carrier substrate being contact-connected via a contact hole which is filled with a connecting layer and is formed in the insulation layer of the semiconductor substrate.

The invention is described in more detail below using exemplary embodiments with reference to the drawing.

In the figures:

FIGS. 1A to 1C show simplified sectional views for illustrating essential method steps in the fabrication of a semiconductor substrate in accordance with a first preferred exemplary embodiment.

Figure 1A:
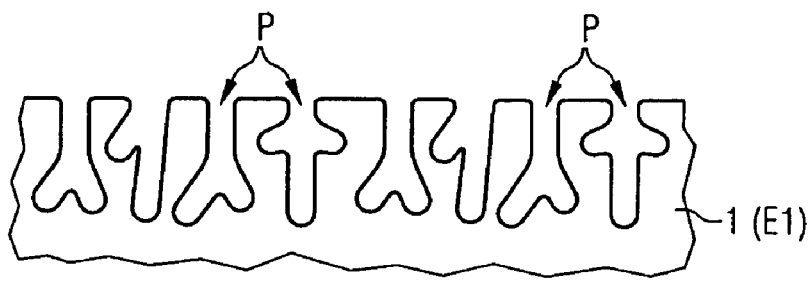
FIGS. 1A to 1D show simplified sectional views for illustrating essential fabrication steps in the fabrication of a semiconductor substrate in accordance with a first exemplary embodiment.

In accordance with FIG. 1A, a multiplicity of depressions P and also a capacitor counterelectrode E1 are formed in a carrier substrate 1, which represents a semiconductor substrate, for example, and preferably a silicon semiconductor wafer. Preferably, a multiplicity of pores P are formed as depressions in the carrier substrate 1, which comprises e.g. n-doped silicon, by means of an electrochemical pore etching method. The carrier substrate has a dopant concentration of approximately $10^{18}$ cm$^{-3}$, for example, and is firstly connected to a first voltage terminal and immersed in a hydrofluoric acid solution (25% by weight). Situated in the hydrofluoric acid solution is an electrode connected to a second voltage terminal. A voltage is subsequently generated between the first voltage terminal and the second voltage terminal, said voltage amounting to approximately 2 volts. The voltage difference between the first and second voltage terminals is positive in this case, a resulting current density amounting to approximately 100 mA/cm$^2$. In this electrochemical pore etching method, pores P approximately 100 nm wide and a few micrometers deep are produced in the carrier substrate 1 after a few minutes, the distances between the adjacent pores P being of about the same magnitude, amounting to approximately 20 nm, and the pores being arranged in spatially non-regular fashion.

In order to produce the capacitor counterelectrode E1 in the carrier substrate 1, a doping of the semiconductor material is carried out for example in the vicinity of the pores P. Preferably, in order to form a highly doped and thus electrically conductive layer, a doping glass is formed in the pores P and then outdiffused into the carrier substrate 1 by means of a thermal treatment. Finally, the doping glass is removed preferably by wet-chemical means, thus resulting in the sectional view illustrated in FIG. 1A. Preferably, phosphosilicate glass having a thickness of a few nanometers is deposited as dopant source in the pores P, thus resulting in an n$^+$-doping at the entire surface in the region of the pores P in the carrier substrate 1. As an alternative, of course, it is also possible to effect vapor phase doping, in particular at low pressures, as is known for example in the fabrication of trench capacitors. Hydrofluoric acid is preferably used as the etchant for removing the doping glass, other etchants also being able to be used.

Accordingly, the pores P formed by the electrochemical pore etching can be produced without targeted seed formation in a random arrangement, their density, their mean diameter, the thickness of the separating walls and the length being able to be set over a wide range through the parameters of the method, such as e.g. semiconductor doping, concentration of the etchant, current intensity, voltage and etching duration.

In accordance with FIG. 1B, a dielectric layer D is subsequently formed at the surface of the depressions P and of the carrier substrate 1, preferably nitrided oxide, $Al_2O_3$ and/or $TiO_2$ being formed as capacitor dielectric over the whole area. Accordingly, in order to form a nitrided oxide, firstly a thermal oxidation of the carrier substrate 1 and a subsequent nitriding are carried out. As an alternative, in order to realize the capacitor dielectrics $Al_2O_3$ and/or $TiO_2$ that are furthermore possible, a deposition of corresponding materials may be carried out. In particular when using high-temperature-resistant capacitor dielectrics which furthermore have a high dielectric constant, a semiconductor substrate is thus obtained which is suitable for a multiplicity of standard processes, i.e. including high-temperature processes, and furthermore realizes capacitors having a high capacitance.

After the whole-area formation of said dielectric layer D in the pores P and also at the surface of the carrier substrate 1, an electrically conductive layer E2 is subsequently formed for realizing a multiplicity of capacitor electrodes at least in the multiplicity of depressions P on the dielectric layer D.

In order to realize the dielectric layer D and/or the electrically conductive layer E2, it is possible, in particular, to use a so-called ALD method (Atomic Layer Deposition) for forming layers of the order of magnitude of individual atomic layers.

Figure 1B:
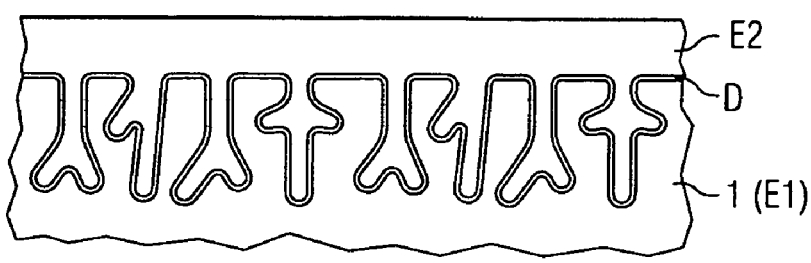

In accordance with FIG. 1B, by way of example, an in-situ-doped polycrystalline semiconductor material and preferably in-situ-doped polysilicon are deposited over the whole area, as a result of which not only are the pores P completely filled, but, moreover, a layer covering all the pores is formed at the surface of the carrier substrate 1. In order to pattern this electrically conductive layer E2 a photolithographic method is preferably carried out, the electrically conductive layer E2 being patterned by means of conventional photoresists, subsequent exposure and final etching in such a way that a multiplicity of individual capacitors (or capacitor electrodes) or group of capacitors formed in the carrier substrate 1 are produced, in accordance with FIG. 1C a predetermined number of individual capacitors (or capacitor electrodes) being combined to form a group and realizing a group capacitor having a predetermined capacitance. Particularly when realizing semiconductor substrates for so-called DRAM memory devices, such patterning may be set in such a way that in each case group capacitors having a desired capacitance of approximately 30 fF are produced, as are customarily required in DRAM cells.

Such patterning is preferably effected by means of anisotropic etching-back methods, such as RIE (Reactive Ion Etching), for example. In order to avoid a short circuit between the outer capacitor counterelectrode E1 and the inner or capacitor electrode E2, the dielectric layer D is preferably not removed.

In accordance with FIG. 1C, a first insulation partial layer 2A is subsequently formed over the whole area at this processed surface of the carrier substrate 1, a TEOS deposition method (tetraethyl orthosilicate) preferably being carried out. In order to realize a planar surface, a CMP method (chemical mechanical polishing) may preferably be carried out after the formation of the insulation partial layer 2A and in particular after the deposition of a TEOS layer.

Figure 1C:
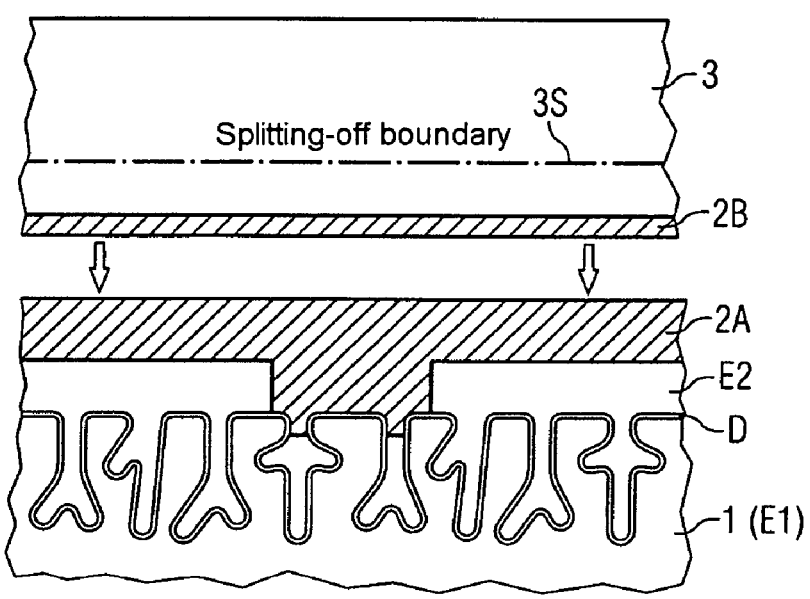

In accordance with FIG. 1C, furthermore, a further semiconductor component substrate 3 with a splitting-off boundary layer 3S and a second insulation partial layer 2B is provided, a silicon semiconductor wafer with a silicon dioxide layer 2B preferably once again being provided and the splitting-off boundary layer being formed by means of hydrogen implantation.

Afterward, these two substrates are connected to one another at or via their insulation partial layers 2A and 2B in order to form a common insulation layer 2, conventional wafer bonding preferably being carried out. More precisely, in particular when using silicon dioxide as insulation partial layers 2A and 2B, on account of their hydrophilic properties, an attractive force is exerted on the two substrates at the connecting surface, a mechanically very strong connection being realized by means of an additional thermal treatment and the use of additional connecting or bonding materials being able to be dispensed with.

Figure 1D:
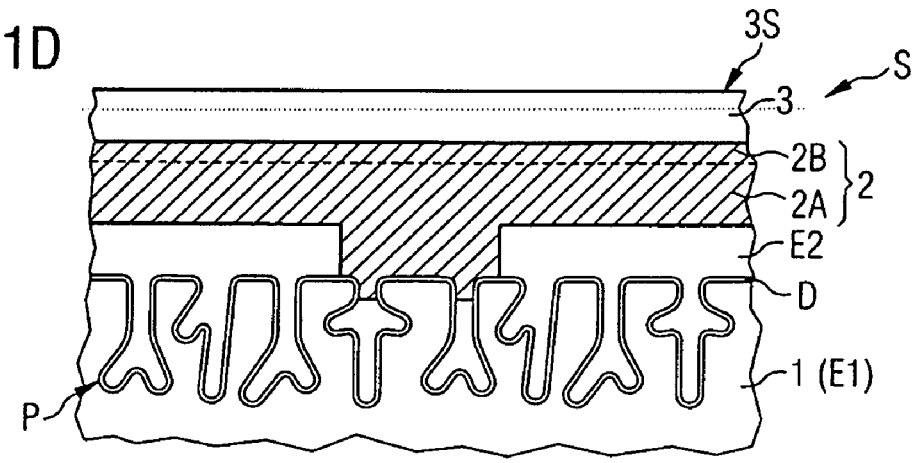

In accordance with FIG. 1D, finally, an (upper) part of the semiconductor component substrate 3 is split off at the splitting-off boundary layer 3S, as a result of which the finished semiconductor substrate S with a multiplicity of buried capacitors is obtained. This splitting-off process is preferably effected by means of a further thermal treatment, the upper part of the wafer breaking off or being split off along the implanted splitting-off boundary layer in the case of the hydrogen implantation described above. As an alternative to this splitting-off process known as a "smart cut" method, it is also possible to carry out further methods such as e.g. the so-called "ELTRAN" method, a porous semiconductor layer being used as splitting-off boundary layer 3S and the upper part of the semiconductor component substrate 3 being able to be lifted off by means of a liquid jet.

Figure 2A:
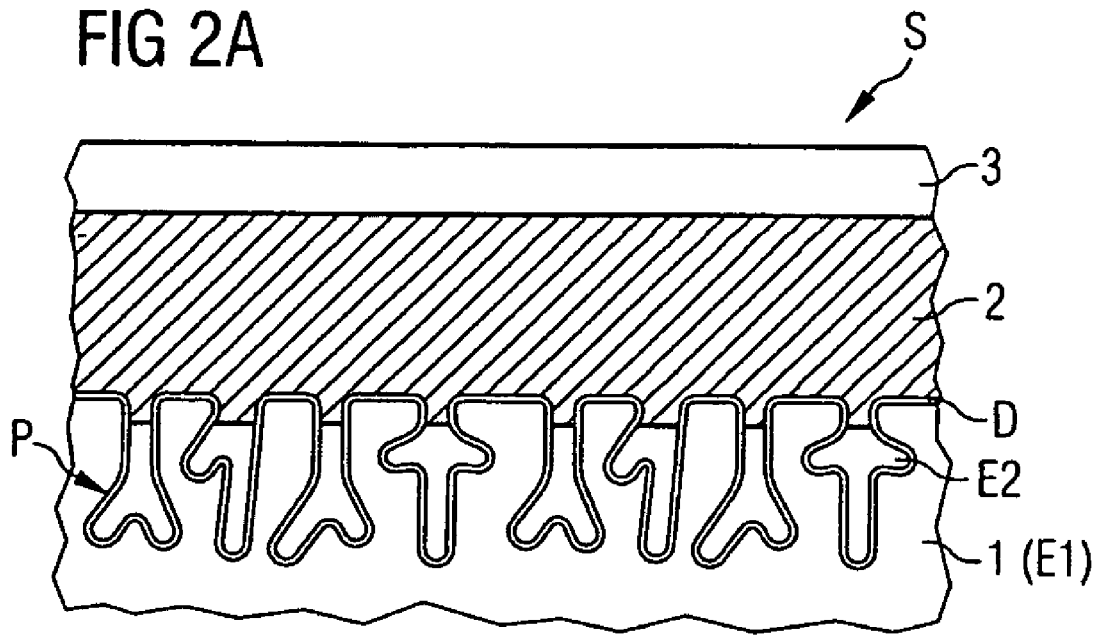
FIGS. 2A and 2B show simplified sectional views for illustrating a semiconductor substrate in accordance with a second exemplary embodiment and an associated method step for fabricating contact holes.
Figure 2B:
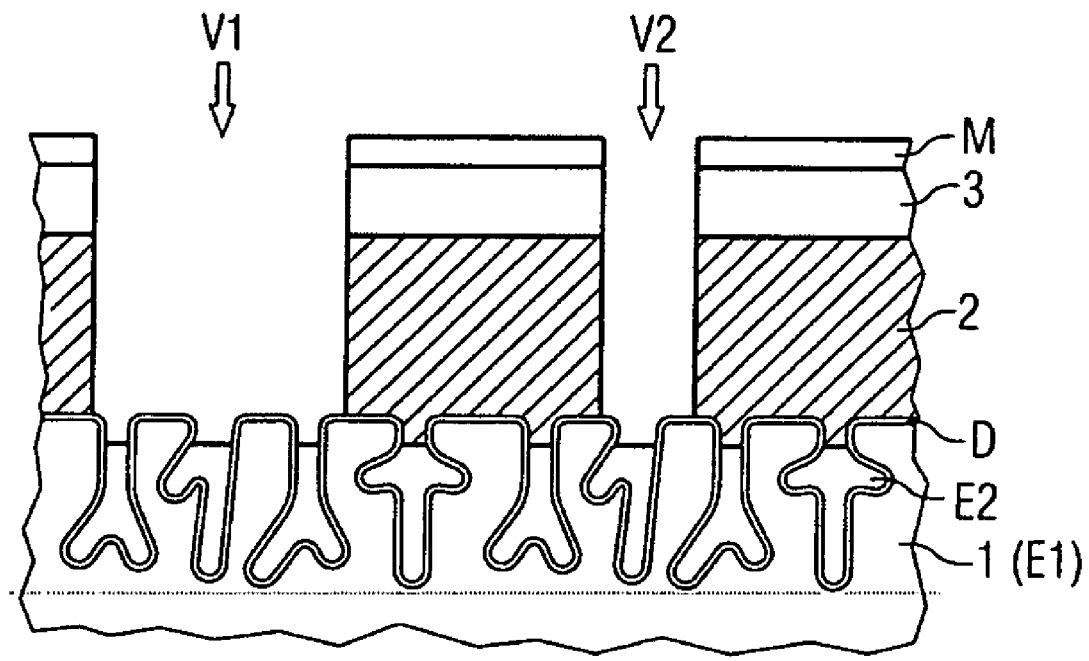

FIG. 2A and FIG. 2B show simplified sectional views for illustrating a semiconductor substrate in accordance with a second exemplary embodiment and a method step for realizing capacitors having different capacitances, identical reference symbols designating identical or corresponding layers or elements and a repeated description being dispensed with below.

In accordance with FIG. 2A, the electrically conductive layer E2 may also be patterned in such a way that individual capacitors are not grouped, as illustrated in FIG. 1C, rather the electrically conductive layer E2 deposited at the surface of the carrier substrate is etched back completely as far as the surface of the carrier substrate 1 or the dielectric layer D or the electrically conductive layer E2 is filled only up to the surface of the pores P. In this way, no electrically conductive connection of the individual capacitors or capacitor electrodes E2 is obtained, for which reason the capacitor capacitance can be defined exclusively by way of the size of a contact hole.

Accordingly, in accordance with FIG. 2B, contact holes V1 and V2 of different sizes may be formed by means of a mask layer M, which contact holes uncover a different number of individual capacitors or number of capacitor electrodes E2, as a result of which a finely granular setting of a capacitance can also be realized in a later fabrication process for realizing a respective semiconductor circuit.

Figure 3A:
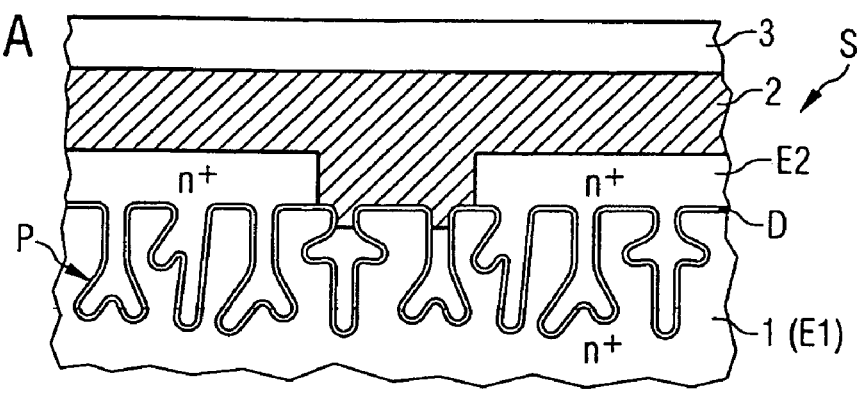
FIGS. 3A to 3C show simplified sectional views for illustrating a fabrication method for a DRAM memory cell.
Figure 3B:
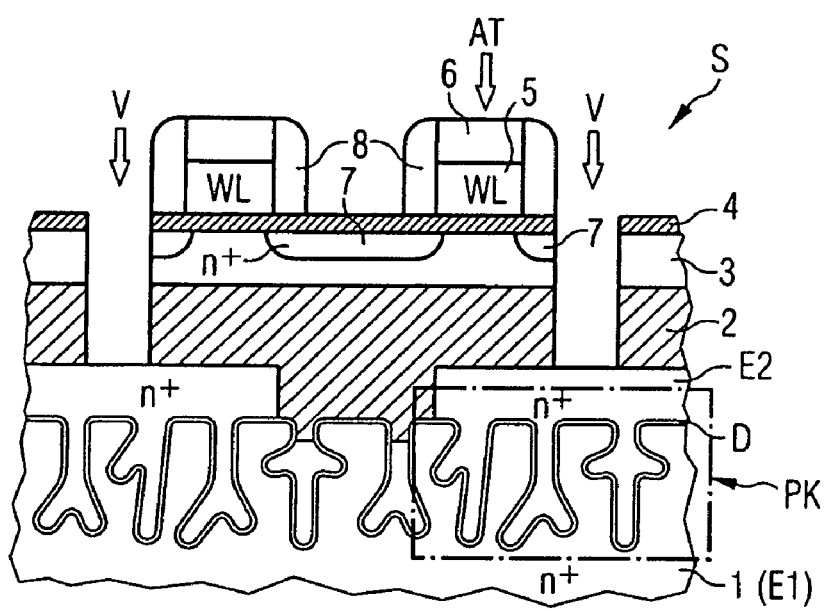
Figure 3C:
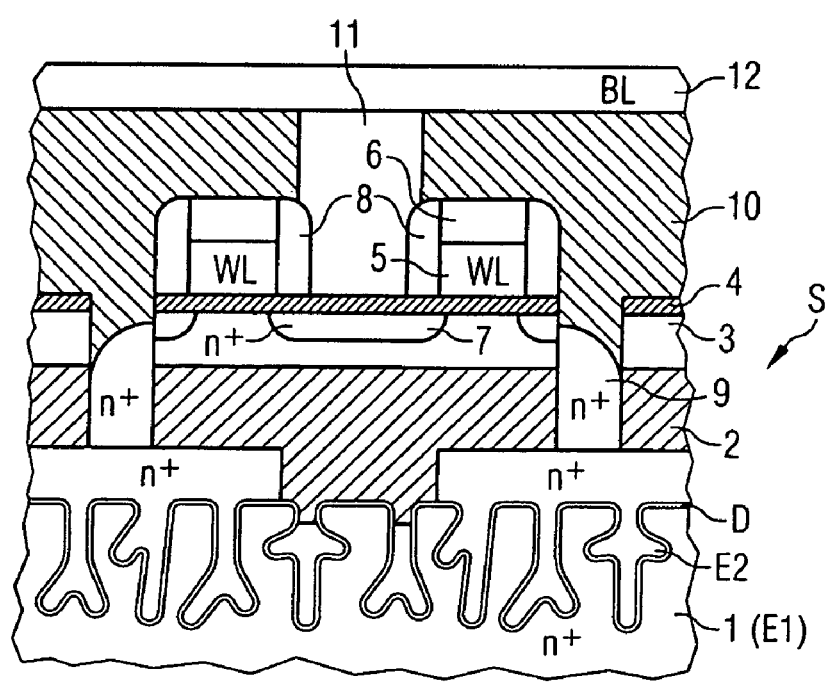

FIGS. 3A to 3C show simplified sectional views for illustrating essential method steps in the fabrication of a semiconductor circuit in a semiconductor substrate in accordance with the first exemplary embodiment, identical reference symbols once again designating identical layers or elements and a repeated description being dispensed with below.

In accordance with FIG. 3A, in order to realize a DRAM memory cell having a selection transistor and a pore capacitor PK (i.e. a number of buried individual capacitors combined in a group), firstly a shallow trench isolation (not illustrated) is formed in the semiconductor component layer 3 for realizing active regions.

Afterward, in accordance with FIG. 3B, by way of example, a conventional process complex for MOS transistors is carried out in order to realize a selection transistor AT as semiconductor component to be formed with source/drain regions 7, a gate dielectric or a gate oxide layer 4, a control layer 5 or wordline WL and a gate insulation or encapsulation having a nitride covering layer 6 and nitride spacers 8, for example. With regard to the individual method steps, reference is explicitly made here to the known standard MOS methods.

Afterward, in order to realize a connection region to the buried capacitor or to the capacitor electrode E2, a contact hole V is formed at least in the insulation layer 2 and the semiconductor component layer 3, in which case, given the presence of the gate oxide layer or the gate dielectric 4, this layer may also be removed locally.

In accordance with FIG. 3B, the contact hole V is formed directly at the sidewalls of the spacers 8 of the selection transistors AT, as a result of which a respective source/drain region 7 and also an associated capacitor electrode E2 are uncovered. Accordingly, a relatively inaccurate photolithographic method may be used for realizing the contact holes V, it merely being necessary to ensure an overlap between the lithography openings and the selection transistor encapsulation or the spacers 8 and the covering layer 6. Accordingly, the contact holes V may be formed in a self-aligning manner.

Preferably, in order to remove the insulation layer 2 of the semiconductor component layer 3 and, if appropriate, the gate dielectric 4 in the region of the contact hole V, an anisotropic etching method and in particular a reactive ion etching (RIE) is carried out.

In accordance with FIG. 3C, a connecting layer 9 is subsequently formed in the contact hole V between semiconductor component or the source/drain region 7 of the selection transistor AT and at least one capacitor electrode E2. Preferably, in order to form said connecting layer 9, a further in-situ-doped polycrystalline semiconductor layer, and in particular polycrystalline silicon, is deposited over the whole area and subsequently etched back isotropically or anisotropically right into the contact hole V.

Finally, in order to complete the DRAM memory cell, an intermediate insulation layer 10 with a bitline contact 11 is formed, which makes contact with a respective complementary source/drain region 7 of the selection transistor AT. In order to realize a bitline BL, finally, an electrically conductive bitline layer 12 is also formed and patterned at the surface of the intermediate insulation layer 10 in a customary manner, thus resulting in the final sectional view of a DRAM memory cell according to the invention as illustrated in FIG. 3C.

The invention has been described above on the basis of an SOI substrate having an Si carrier substrate, an $SiO_2$ insulation layer and a monocrystalline Si semiconductor component layer, polycrystalline silicon being used as the electrically conductive layer and nitrided oxide being used as the dielectric layer. In the same way, it is also possible, of course, to use alternative materials and corresponding layers for realizing the semiconductor substrate according to the invention and the associated semiconductor circuit. In particular, an electrically conductive or electrically insulated substrate with an integrated capacitor counterelectrode may also be used as the carrier substrate. In the same way, besides the dopings presented, it is also possible to use the respective opposite dopings. For the electrically conductive layer, in particular, it is also possible to use metallic materials for realizing the capacitor counterelectrodes.

Furthermore, the invention is not restricted to the dram cell present, but rather encompasses in the same way any semiconductor components which are formed in a semiconductor substrate according to the invention and make contact with a buried capacitor via a contact hole and a connecting layer situated therein.

| List of Reference Symbols | |
|---|---|
| 1 | Carrier substrate |
| 2, 2A, 2B | Insulation layer |
| 3 | Semiconductor component layer |
| 3S | Splitting-off boundary layer |
| 4 | Gate dielectric |
| 5 | Control layer |
| 6 | Covering layer |
| 7 | Source/drain regions |
| 8 | Spacer |
| 9 | Connecting layer |
| 10 | Intermediate insulation layer |
| 11 | Bitline contact |
| 12 | Bitline layer |
| P | Depression, pores |
| E1 | Capacitor counterelectrode |
| D | Dielectric layer |
| E2 | Capacitor electrode |
| S | Semiconductor substrate |
| M | Mask layer |
| V, V1, V2 | Contact hole |
| PK | (Group) Capacitor |
| WL | Wordline |
| DL | Bitline |

The invention claimed is:

1. A method for fabricating a semiconductor substrate comprising:
   a) formation of a multiplicity of depressions and a capacitor counterelectrode in a carrier substrate;
   b) formation of a dielectric layer at a surface of the depressions and of the carrier substrate;
   c) formation and patterning of an electrically conductive layer on the dielectric layer for realizing a multiplicity of capacitor electrodes at least in the multiplicity of depressions;
   d) formation of a first insulation partial layer at the processed surface of the carrier substrate;
   e) provision of a semiconductor component substrate with a splitting-off boundary layer, and a second insulation partial layer;
   f) connection of the semiconductor component substrate and the carrier substrate at their insulating partial layers to form an insulation layer; and
   g) splitting off part of the semiconductor component substrate at the splitting-off boundary layer.

2. The method as claimed in claim 1, wherein, in step a),
   a1) an electrochemical pore etching is carried out for forming as depressions in the semiconductor substrate; and
   a2) a doping of the semiconductor substrate is carried out in the vicinity of the pores for forming a further electrically conductive layer as capacitor counterelectrode.

3. The method as claimed in 2, wherein, in step a2),
   a21) a formation of a doping glass is carried out at least in the pores;
   a22) a thermal treatment is carried out; and
   a23) a wet-chemical removal of the doping glass is carried out.

4. The method as claimed in claim 1, wherein, in step b), a high-temperature-resistant capacitor dielectric with a high dielectric constant is formed over a whole area of the surface of the depressions and of the carrier substrate.

5. The method as claimed in patent claim 4, wherein at least one of nitrided oxide, $Al_2O_3$ and $TiO_2$ is formed as the capacitor dielectric.

6. The method as claimed in claim 1, wherein, in step c),
   c1) the electrically conductive layer is formed for filling the depressions over a whole area of the dielectric layer; and
   c2) the electronically conductive layer is at least partially or completely removed as far as the dielectric layer at the surface of the carrier substrate.

7. The method as claimed in patent claim 6, wherein,
   in step c1), in-situ-doped polysilicon is deposited; and
   in step c2), photolithographic patterning with an isotropic etching-back is carried out in such a way that a multiplicity of capacitor electrodes are connected to one another for realizing a group capacitor.

8. The method as claimed in claim 1, wherein in step d), a TEOS deposition method is carried out.

9. The method as claimed in claim 1, wherein in step e), a semiconductor wafer with an oxide layer (2B) is provided, the splitting-off boundary layer being formed by means of hydrogen implantation.

10. The method as claimed in claim 1, wherein in step f), the connection is carried out by means of wafer bonding.

11. The method as claimed in claim 1, wherein in step g), the splitting off is carried out by means of a further thermal treatment.

12. A method for fabricating a DRAM memory cell in a semiconductor substrate, the method comprising:
   a) fabrication of the semiconductor substrate including:
      a0) formation of a multiplicity of depressions and a capacitor counterelectrode in the semiconductor substrate;
      b0) formation of a dielectric layer at a surface of the depressions and of the semiconductor substrate;
      c0) formation and patterning of an electrically conductive layer on the dielectric layer for realizing a multiplicity of capacitor electrodes at least in the multiplicity of depressions;
      d0) formation of a first insulation partial layer at the processed surface of the semiconductor substrate;
      e0) provision of a semiconductor component substrate with a splitting-off boundary layer, and a second insulation partial layer;
      f0) connection of the semiconductor component substrate and the semiconductor substrate at their insulating partial layers to form an insulation layer; and g0) splitting off part of the semiconductor component substrate at the splitting-off boundary layer to form a semiconductor component layer, the method further comprising:
b) formation of a shallow trench isolation in the semiconductor component layer for realizing active regions;
c) formation of a selection transistor having source/drain regions, a gate dielectric, a control layer serving as word line and a gate insulation;
d) formation of a contact hole at least in the insulation layer and the semiconductor component layer;
e) formation of a connecting layer in the contact hole between a source/drain region of the selection transistor and at least one capacitor electrode;
f) formation of an intermediate insulation layer with a bitline contact to a complementary source/drain region; and
g) formation and patterning of a bitline layer for realizing a bitline at the surface of the intermediate insulation layer.

13. The method as claimed in claim 12, wherein in step d) the contact hole is etched free in a self-aligning manner using the gate insulation and a lithographic method.

14. The method as claimed in claim 12, wherein in step e) to form the connecting layer, a further in-situ-doped polycrystalline semiconductor layer is deposited over the whole area of the semiconductor substrate and subsequently etched back isotropically or anisotropically.

* * * * *

UNITED STATES PATENT AND TRADEMARK OFFICE
CERTIFICATE OF CORRECTION

PATENT NO. : 7,214,582 B2  
APPLICATION NO. : 10/523944  
DATED : May 8, 2007  
INVENTOR(S) : Franz Hofmann et al.

Page 1 of 1

It is certified that error appears in the above-identified patent and that said Letters Patent is hereby corrected as shown below:

On the Title Page

In column 1, item (75), after "Lothar" delete "Risoh" and substitute --Risch-- in its place.

In column 1, line 1, under "Foreign Application Priority Data", after "102 42" delete "877" and substitute --877.8-- in its place.

In the Claims

Columns 8-10, in claim 12, line 29, before "and a gate insulation" delete "word line" and substitute --wordline-- in its place.

Signed and Sealed this

Twenty-third Day of October, 2007

JON W. DUDAS  
*Director of the United States Patent and Trademark Office*